United States Patent [19]

Dore

[11] Patent Number: 5,598,328

[45] Date of Patent: Jan. 28, 1997

[54] FILTER MODULE FOR A FREQUENCY CONVERTER

[75] Inventor: Christophe Dore, Fontenay Le Fleury, France

[73] Assignee: Telemecanique, Rueil Malmaison, France

[21] Appl. No.: 441,643

[22] Filed: May 15, 1995

Related U.S. Application Data

[63] Continuation of Ser. No. 151,186, Nov. 12, 1993, abandoned.

[30] Foreign Application Priority Data

Nov. 27, 1992 [FR] France ................................. 92 14529

[51] Int. Cl.$^6$ .............................. H02M 7/12; H05K 7/20
[52] U.S. Cl. .............................. 363/141; 363/15; 363/47; 361/694; 361/735
[58] Field of Search ..................................... 363/141, 146

[56] References Cited

U.S. PATENT DOCUMENTS

| | | | |
|---|---|---|---|
| 4,691,274 | 9/1987 | Matouk et al. | 363/141 |
| 4,794,509 | 12/1988 | Nussbaumer | 363/141 |
| 4,872,102 | 10/1989 | Getter | 363/141 |
| 5,088,016 | 2/1992 | Vinciarelli et al. | 363/15 |
| 5,103,388 | 4/1992 | Williams et al. | 363/69 |
| 5,170,336 | 12/1992 | Getter et al. | 363/141 |
| 5,184,291 | 2/1993 | Crowe et al. | 363/37 |
| 5,289,363 | 2/1994 | Ferchau et al. | 363/141 |
| 5,297,015 | 3/1994 | Miyazaki et al. | 363/146 |
| 5,315,497 | 5/1994 | Severinsky | 363/34 |
| 5,369,565 | 11/1994 | Chen et al. | 363/146 |
| 5,418,707 | 5/1995 | Shimer et al. | 363/65 |

FOREIGN PATENT DOCUMENTS 0267129  5/1988  European Pat. Off. .

*Primary Examiner*—Steven L. Stephan
*Assistant Examiner*—Nicholas Ponomarenko
*Attorney, Agent, or Firm*—Oblon, Spivak, McClelland, Maier, & Neustadt, P.C.

[57] ABSTRACT

A filter module for a frequency converter comprises a filter circuit housed in a casing adapted for connection to the converter. The filter module includes an input filter and an output filter so arranged that input terminals for connection to the AC line voltage and output terminals for connection to an electric motor are disposed on a common side of the casing and so that the connections between the frequency converter and the filter module are disposed on a side of the casing which in use faces the converter.

6 Claims, 2 Drawing Sheets

FILTER MODULE FOR A FREQUENCY CONVERTER

This application is a continuation of application Ser. No. 08/151,186, filed on Nov. 12, 1993, now abandoned.

BACKGROUND OF THE INVENTION

1. Field of the Invention

The present invention concerns a filter module for a frequency converter comprising a filter circuit housed in a casing for connection to said converter.

2. Description of the Prior Art

Frequency converters for supplying power to three-phase asynchronous motors essentially comprise a rectifier (AC-DC converter) which supplies a DC voltage to a smoothing or filter capacitor and an inverter (DC-AC converter) using power transistors or thyristors and energized by said filtered DC voltage.

The rectifier is a rectifier bridge connected to a single-phase or three-phase AC line voltage.

The inverter is connected to the phase windings of the motor. It generates a three-phase variable voltage and frequency power supply from the DC voltage supplied by the rectifier.

The transistors are operated in pulse width modulation (PWM) mode to generate a waveform as close as possible to a sine wave.

In many operating environments it is necessary to add to the frequency converter one or more of the following five types of filters:

- an input filter to limit the propagation of radio-frequency interference on the mains power supply;
- an input filter to limit low-frequency harmonics of the AC line voltage frequency generated by the converter;
- an input filter to enhance the immunity of the converter to AC line voltage surges;
- an output filter to limit propagation of radio-frequency conducted electromagnetic interference in the motor power supply cable;
- output filter to limit voltage surges and sudden radio-frequency fluctuations at the motor terminals.

SUMMARY OF THE INVENTION

An object of the present invention is to combine in a single auxiliary module input and output filters of several or all the previously defined filter types. The compact filter module filters the converter input and output, is easy to connect to the converter and enables efficient ventilation of the converter.

The invention includes a frequency converter filter module comprising a filter circuit housed in a casing for connection to said converter and including an input filter and an output filter so arranged that input terminals for connection to an AC line voltage and output terminals for connection to an electric motor are disposed on a common side of said casing and so that the connections to said frequency converter are disposed on a side of said casing which in use faces said converter.

The input filter and the output filter preferably have a common ground.

The module preferably has fixing arrangements whereby a ventilation passage is provided for the frequency converter.

The invention will now be described in more detail with reference to one embodiment shown by way of example in the appended drawings.

DETAILED DESCRIPTION OF THE PREFERRED EMBODIMENTS

Figure 1:
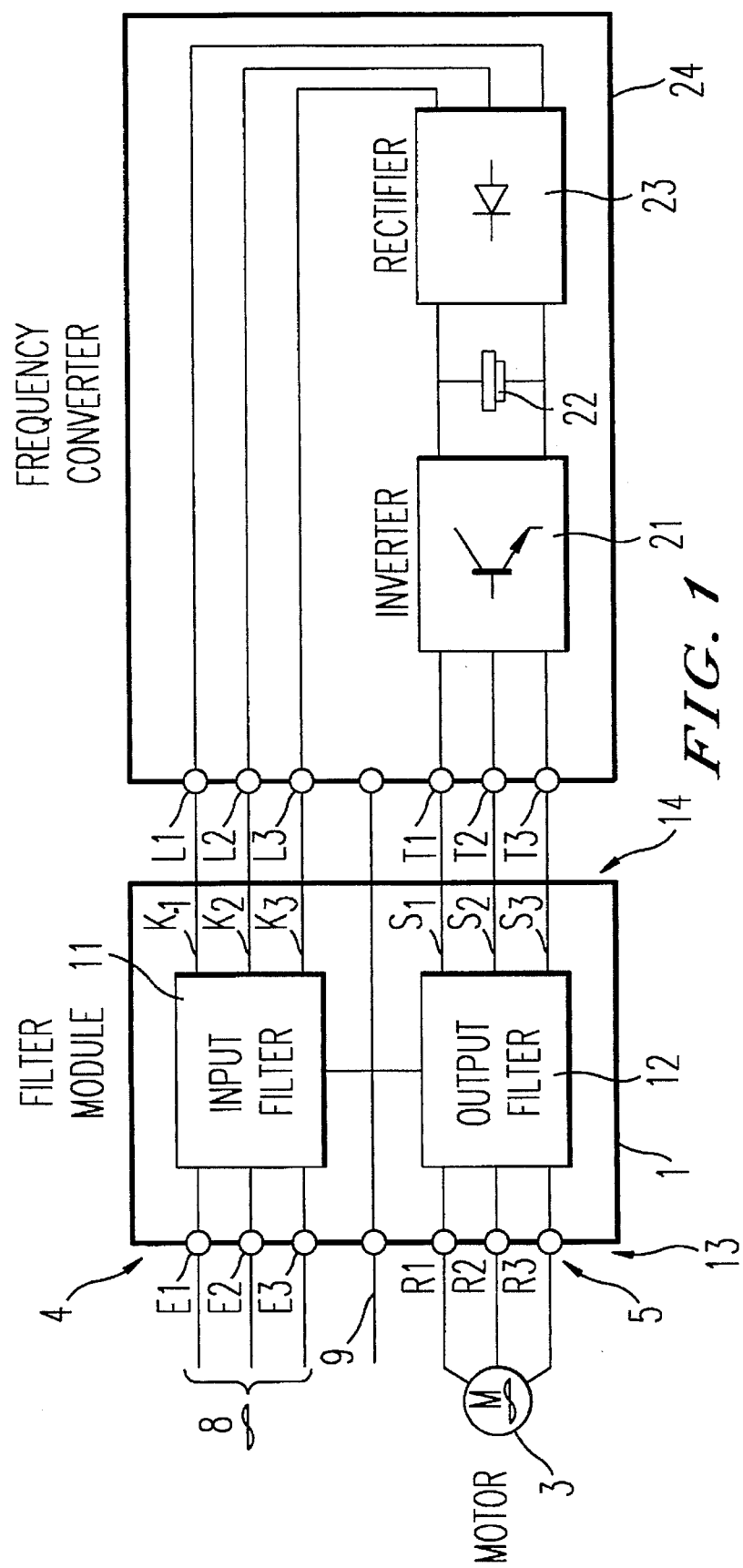
FIG. 1 is a block diagram of a frequency converter fitted with a filter module in accordance with the invention.
Figure 2:
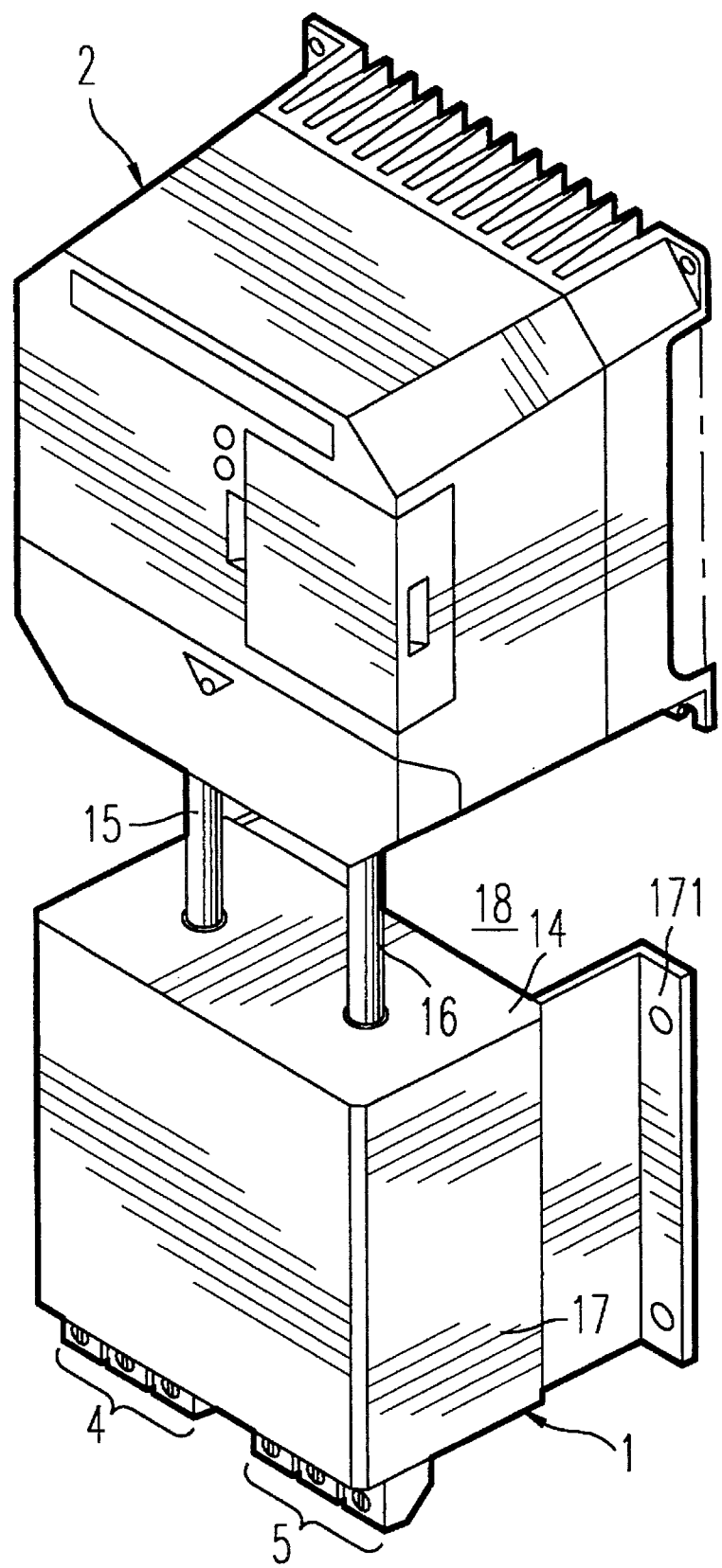
FIG. 2 is a perspective view of the frequency converter and the associated filter module in accordance with the invention.

The filter module 1 in accordance with the invention is associated with a solid-state frequency converter 2 constituting a variable speed controller for an electric motor. The frequency converter 2 includes an inverter 21 which is connected via a smoothing or filter capacitor 22 to a diode rectifier 23 connected to the AC line voltage phase conductors. The inverter 21 has three bridge arms each connected to one phase winding of an asynchronous motor 3.

Each arm of the inverter conventionally comprises two solid-state switches with associated recovery diodes. The common point of each pair of switches in the same arm is connected to a phase winding of the motor 3.

The solid-state switches are bipolar or MOS transistors or MOS-bipolar components such as IGBT or gate turn off (GTO) thyristors or other like switchable components.

A control circuit turns the switches on and off according to a specific scenario.

The filter module 1 has input terminals $E_1$, $E_2$, $E_3$ to be connected to the AC line voltage phase conductors 8. This set 4 of input terminals is connected to an input filter 11 in the casing 17 of the module 1. The outputs $K_1$, $K_2$, $K_3$ of the input filter 11 constitute a bundle 15 of conductors which are connected to the input terminals $L_1$, $L_2$, $L_3$ of the frequency converter 2.

The output terminals $T_1$, $T_2$, $T_3$ of the frequency converter 2 are connected to conductors $S_1$, $S_2$, $S_3$ of a bundle 16 which terminates at an output filter 12 in the casing 17 of the filter module 1. The outputs of the output filter 12 are connected to output terminals $R_1$, $R_2$, $R_3$ which are in turn connected to the motor 3. The output terminals form a set 5.

The input terminals 4 to be connected to the AC line voltage and the output terminals 5 to be connected to the motor are on the same side 13 of the casing. The bundles 15 and 16 of conductors connected to the frequency converter 2 are on the side 14 of the casing 17 facing said converter 2.

The input filter 11 and the output filter 12 have a common ground 9. A terminal on the side 13 of the casing is used to ground the filters 11 and 12 and the converter 2.

The filter module 1 is pre-wired for fast and error-free connection to the converter 2.

It is fixed to a support shared with the frequency converter 2, yielding a combination whose use (installation, connection, fixing) is optimized.

The casing 17 of the filter module has lugs 171 for fixing it to a rail or panel. The bottom of the casing facing the fixings is offset from the plane of the fixing lugs to leave a passage 18 for ventilating the heatsink of the frequency converter.

By virtue of the arrangement adopted the filter module 1 is easily connected to the frequency converter 2.

Obviously variations and detailed improvements may be put forward and the use of equivalent means considered without departing from the scope of the invention.

There is claimed:

1. An apparatus comprising:
   a self-contained unitary frequency converter comprising:
   a rectifier; and
   an inverter connected to receive an output of the rectifier;
   a self-contained unitary filter module comprising:
   an input filter having an output connected to the rectifier of the frequency converter; and
   an output filter having an input to receive an output from the inverter of the frequency converter.

2. The apparatus according to claim 1, further comprising a filter capacitor connected to a point between the rectifier and the inverter of the frequency converter.

3. The apparatus according to claim 1, wherein said input filter and said output filter comprise a common ground.

4. The apparatus according to claim 1, wherein said filter module further comprises fixing arrangements for providing a passage for ventilating said frequency converter.

5. The apparatus according to claim 1, wherein said filter module is pre-wired.

6. A filter module for a frequency converter, said frequency converter having a rectifier with an output connected to an input of a filter capacitor, said filter capacitor having an output connected to an input of an inverter said filter module comprising:

a casing having first and second sides;

an input filter having input terminals arranged on the first side of the filter module for connection to an AC line voltage and having output terminals arranged on the second side of the filter module;

an output filter having input terminals arranged on the second side of the filter module for connection to the output terminals of the frequency converter and having output terminals arranged on the first side of the filter module for connection to a load; and connecting means on the second side of the filter module for connecting the output terminals of the input filter to input terminals of the rectifier of the frequency converter and for connecting output terminals of the inverter of the frequency converter to the input terminals of the output filter, wherein the connecting means are located entirely on the second side of the filter module for connecting the filter module to the frequency converter.

\* \* \* \* \*